United States Patent [19]

Tutt et al.

[11] Patent Number: 4,888,204
[45] Date of Patent: Dec. 19, 1989

[54] PHOTOCHEMICAL DEPOSITION OF HIGH PURITY GOLD FILMS

[75] Inventors: Lee W. Tutt, Thousand Oaks; John E. Jensen, Newbury Park, both of Calif.

[73] Assignee: Hughes Aircraft Company, Los Angeles, Calif.

[21] Appl. No.: 242,670

[22] Filed: Sep. 12, 1988

[51] Int. Cl.$^4$ .................. B05D 3/06; B05D 5/12; C23C 16/00

[52] U.S. Cl. ................. 427/53.1; 427/54.1; 427/126.5; 427/253; 427/62

[58] Field of Search .......... 427/53.1, 54.1, 126.5, 427/252, 253

[56] References Cited

U.S. PATENT DOCUMENTS

| | | | |
|---|---|---|---|
| 3,484,263 | 12/1969 | Kushihashi et al. | 427/42 |
| 3,594,216 | 7/1971 | Charles et al. | 427/252 |
| 3,661,959 | 5/1972 | Vaughan | 427/253 |
| 3,856,581 | 12/1974 | Smeggil et al. | 427/252 |
| 3,892,599 | 7/1975 | Smeggil et al. | 427/253 |
| 4,009,297 | 2/1977 | Redmond et al. | 427/54.1 |
| 4,359,485 | 11/1982 | Donnelly et al. | 427/53.1 |
| 4,619,838 | 10/1986 | Meier et al. | 427/54.1 |
| 4,714,627 | 12/1987 | Puddephatt et al. | 427/53.1 |

OTHER PUBLICATIONS

Ehrlich et al., "Photodeposition of Metal Films with UV Laser Light", *J. Vac. Sci. Technol.*, 21(1), May/Jun. 1982, pp. 23–32.

Karlicek et al., "Laser-Induced Metal Deposition on InP", *J. Appl. Phys.*, 53(2), Feb. 1982, pp. 1084–1090.

*Primary Examiner*—Norman Morgenstern
*Assistant Examiner*—Marianne L. Padgett
*Attorney, Agent, or Firm*—W. K. Denson-Low; P. M. Coble

[57] ABSTRACT

High purity gold films are photochemically deposited on substrates from the gold containing compound $(CH_3)_2Au[CH(COCF_3)_2]$. A vapor of the gold containing organometallic compound, possibly mixed with a carrier gas, is flowed over the surface of the substrate, which is at 0° C. to 160° C., and preferably at ambient temperature. Photodissociation is induced with ultraviolet light, inasmuch as the organometallic compound is strongly absorbing in the range of from about 300 to 340 nanometers. Substantially no organic fragments are deposited upon the surface, so that the deposited gold film is of high purity.

18 Claims, 1 Drawing Sheet

PHOTOCHEMICAL DEPOSITION OF HIGH PURITY GOLD FILMS

This invention was made pursuant to Contract N00014-81-C-0642 awarded by the Department of the Navy. The U.S. Government has certain rights in this invention.

BACKGROUND OF THE INVENTION

This invention relates to the photochemical deposition of films, and, more particularly, to such deposition of high purity gold films having substantially no organic contamination.

Thin gold films are widely used throughout industry to protect substrates, to give them a distinctive appearance, to form electrical contacts, and for other reasons. A number of different deposition techniques are employed. Gold may be plated electrochemically, spun into substrates from gold-containing organometallic sources, and deposited by various dry deposition techniques wherein no water or other carrier liquid contacts the substrate. In physical vapor evaporation, for example, gold from a metallic source is heated to evaporate gold atoms from the source. The evaporated atoms deposit upon the target substrate surface. Evaporation methods are used to coat areas that are in a line of sight with the source.

Another method is thermally assisted deposition of gold from a gas containing a source of gold. As usually practiced, a gold-containing organometallic compound is mixed with a carrier gas and passed over a heated substrate, so that the organometallic compound decomposes at the surface of the substrate to deposit gold onto the surface. In different variations of thermally assisted deposition, the substrate may be heated by conduction or by irradiation, as with a laser, or from any other suitable source.

Yet another method for depositing gold is by photochemical deposition at ambient or other low temperature from a gold-containing compound. Such low temperature deposition is important industrially, because heating of the substrate is not possible in many applications where there is a need to deposit a gold layer. For example, in some electronics applications the heating of the substrate would cause degradation of the structure of a microelectronic device upon which the gold is to be deposited. Elevated temperatures, whether produced by conduction heating or laser, are therefore unacceptable, and deposition must occur at or near room temperature.

In photochemical deposition, energy for the decomposition is provided from photons interacting with the gold source compound. The gold-containing compound preferentially absorbs light of particular wavelengths, and light within the absorption band is directed at or near the surface of the substrate so that the gold-containing organometallic molecule decomposes to deposit metallic gold on the substrate.

Although a number of different approaches have been attempted to deposit gold photochemically without raising the temperature of the substrate substantially, all suffer from the common problem that the deposited gold layer incorporates a high level of carbon, oxygen, or other impurity. The impurity level is at least several percent, and more typically is on the order of 30 percent or more. This high impurity level increases the electrical resistance of the gold film to unacceptably high levels for many applications. Impure gold is also more porous than pure gold, and forms a less protective layer than does pure gold. Where the gold is present primarily to protect the surface from, for example, oxidation, the availability of a higher purity gold film becomes highly significant. There has been much study of the mechanisms of contamination of the gold film, and the consensus is that fragments of the organometallic compound, produced upon dissociation, are deposited upon the surface and incorporated into the growing gold film along with the gold.

Accordingly, there exists a need for a process for photochemically depositing gold at ambient temperatures, without contamination of the gold deposit by carbon, oxygen, or other contaminants. The present invention fulfills this need, and further provides related advantages.

SUMMARY OF THE INVENTION

The process of the present invention deposits a layer of gold upon a substrate at ambient temperature using dry deposition. The process does not require electrical conductivity of the substrate, and therefore is operable with conductive, semiconductive, superconductive, and nonconductive substrates. The substrate is not heated to elevated temperature by the deposition procedure, with the result that structures already present in the substrate are not thermally damaged, either directly as by heating or indirectly as through thermal diffusion damage. The deposited gold layer is pure, with impurity contents below the level of detection of conventional measurement apparatus. The process may be accurately controlled in readily available apparatus that is not complex, and is suitable for coating irregular shapes and difficult to reach locations.

In accordance with the invention, a process for depositing a layer of gold onto a substrate comprises the steps of furnishing a substrate having a surface upon which the gold is to be deposited, the substrate being at a temperature of from about 0° to about 160° C. contacting the surface of the substrate with a gas containing the organometallic compound $(CH_3)_2Au[CH(COCF_3)_2]$; and photodissociating the organometallic compound with ultraviolet light to deposit gold therefrom onto the surface of the substrate. The most preferred substrate temperature is ambient temperature, with temperatures in the range of 20° to 30° C. also highly favored. It is preferred that the substrate temperature not exceed 140° C.

The key to the present process is the deposition of gold by photodissociation of the organometallic compound $(CH_3)_2Au[CH(COCF_3)_2]$, using a relatively low intensity of ultraviolet light to induce photodissociation. The organometallic compound $(CH_3)_2Au[CH(COCF_3)_2]$ is variously known in the technical literature as dimethyl gold hexafluoroacetylacetonate and dimethyl hexafluoro (2,4-pentanedionato) gold (III), and is sometimes abbreviated as AuHFAA or $Me_2Au(hfac)$. It is available commercially from American Cyanamid Corp. The compound is liquid at ambient temperature with a vapor pressure of about 0.7 Torr. The organometallic compound is normally mixed with a carrier gas for transport from the liquid state to the surface of the substrate.

The compound $(CH_3)_2Au[CH(COCF_3)_2]$ is derived from the structurally related compound $(CH_3)_2Au[CH(COCH_3)_2]$ by replacing six hydrogen atoms with fluorine atoms. The replacement increases the vapor pressure of the compound at ambient temperature, making it easier to provide a sufficient amount of the compound in a gas stream.

The compound $(CH_3)_2Au[CH(COCF_3)_2]$ is contacted to the surface of the substrate, and photodissociated by directing ultraviolet light of from about 300 to about 340 nanometers wavelength into the vapor. Preferably, the ultraviolet light is produced by a xenon chloride laser operating at 308 nanometers, in a pulsed mode. The ultraviolet light does not appreciably heat the substrate.

The present approach is to be distinguished from prior approaches. Deposition is performed with the substrate below the thermal decomposition temperature of the gold-containing compound. Only photochemical energy, not thermal energy beyond that available at the phodissociation temperature, is used. The gold deposited by the present approach is of high purity, with no measurable trace of carbon, oxygen, or other contaminants using instrumentation sensitive to levels less than one percent. Such high purity layers have not been previously prepared using decomposition at low temperatures.

The present invention therefore provides an important advance in the art. High purity gold layers are deposited without heating the substrate to unacceptably high temperature. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
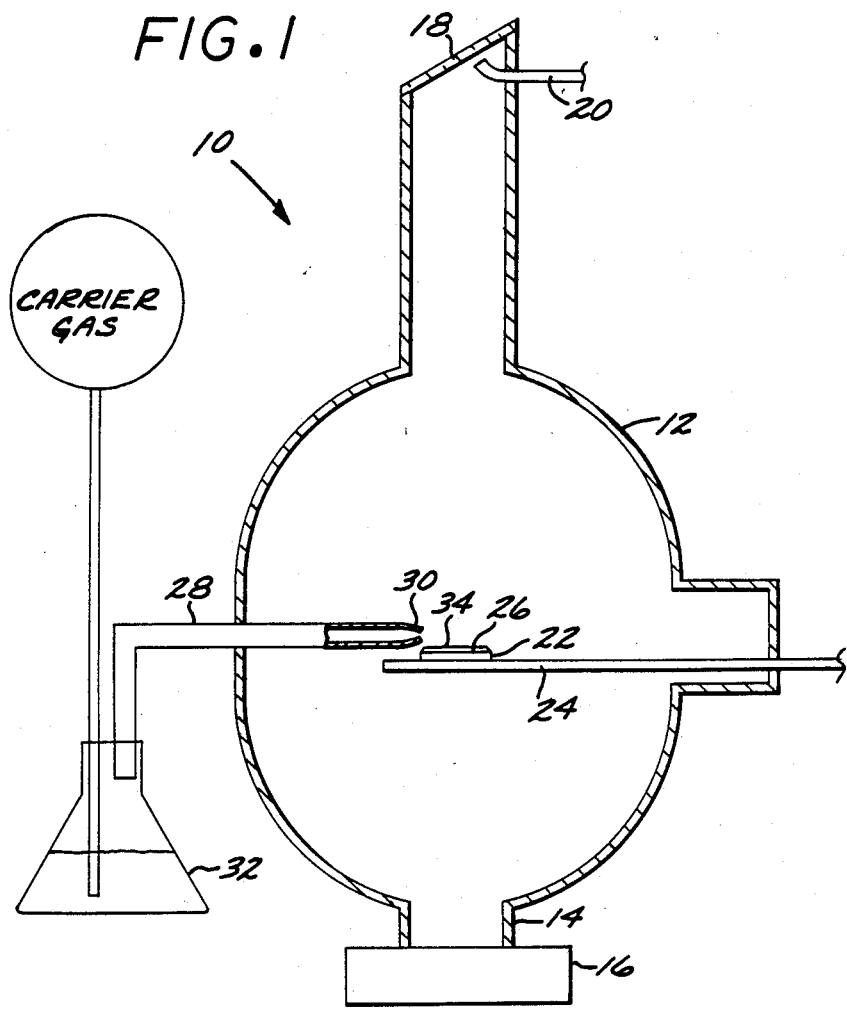
FIG. 1 is a schematic illustration of an apparatus for depositing a layer of gold.

An apparatus 10 used in the deposition of thin gold films is illustrated in FIG. 1. The apparatus 10 includes a chamber 12 that is vacuum tight. A port 14 leads to a vacuum pump 16 used to evacuate the chamber and remove undeposited gas decomposition products and unreacted gasses from the chamber 12. A transparent window 18 is provided in the wall of the chamber 12. To prevent deposition upon, and fogging of, the window 18, a conventional inert gas purge tube 20 is positioned to direct a stream of inert gas such as helium at the inner surface of the window 18.

A substrate 22 is supported on a holder 24 from one wall of the chamber 12. A surface 26 of the substrate 22 is disposed so as to face the window 18 in the illustrated embodiment. The surface 26 could also be positioned so that it is obliquely angled toward the window 18. The substrate is not heated by a heater or other means in the preferred embodiment, and remains at about ambient temperature throughout the deposition.

However, it is understood that the substrate may be heated to a moderately high temperature, or cooled to a moderately low temperature, with the process of the invention remaining operable. The minimum operating temperature for the process is about 0° C., because at lower temperatures a substantial amount of condensation (instead of dissociation) of the gold-containing compound onto the substrate surface occurs as its vapor pressure is reduced, resulting in the presence of organic contaminants on the substrate surface. As to the maximum operable temperature, the thermal decomposition of $(CH_3)_2Au[CH(COCF_3)_2]$ begins at a temperature of about 140° C., but a significant rate of thermal decomposition is observed at temperatures of 160° C. and greater. Preferably, then, the deposition temperature is less than 140° C., to avoid the possibility of thermal decomposition entirely. The maximum deposition temperature for the process is about 160° C., because at higher temperatures there will be a large amount of thermal decomposition that deposits organic fragments onto the surface. The light-induced decomposition of the invention does not result in deposition of such organic fragments in the film. Temperatures near ambient, particularly in the range of 20°–30° C. are the most preferred, to minimize the contaminants in the deposited film, avoid diffusional migration in the film and the substrate, and avoid condensation of the organic compound on the substrate and the film.

A source gas tube 28 is also supported from one wall of the chamber 12, with a nozzle end 30 directed toward the surface 26 of the substrate 22. The organometallic source gas, alone or mixed with a carrier gas, is forced through the tube 28 under pressure and is delivered to the neighborhood of the surface 26. There, a portion of the source gas is decomposed so that gold is deposited upon the surface 26. The vacuum pump 16 draws unreacted gas products, unreacted inert gas, and decomposition products from the chamber 12, so that the pressure is maintained and unneeded gases are removed from the reaction zone.

Decomposition is effected by ultraviolet light directed toward the surface 26 through the window 18. The ultraviolet light causes the organometallic compound to dissociate into gold and organic fragments. It is a particular advantage of the present process that very little of the organic material is deposited onto the substrate 22 along with the gold.

The gas delivered through the tube 28 is supplied by any appropriate means. Since the organometallic source is liquid at ambient temperature when unexcited, a flask 32 of the source liquid is provided. In the preferred approach, helium, argon, nitrogen, or other nonreacting gas is bubbled through the flask 32. The bubbled carrier gas mixes with organometallic source gas vapor, the mixture being carried through the tube 28 to the surface 26 of the substrate 22 for reaction.

Figure 2:
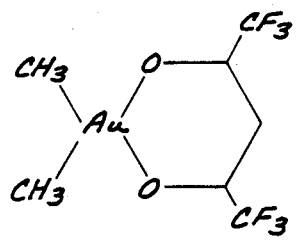
FIG. 2 represents the chemical structure of the compound $(CH_3)_2Au[CH(COCF_3)_2]$.

The organometallic source material used in the decomposition is $(CH_3)_2Au[CH(COCF_3)_2]$, whose structure is illustrated in FIG. 2. In the preferred approach, an inert gas, preferably helium, is bubbled through a flask 32 of the liquid source material maintained at room temperature, at a rate of from about 0.1 to about 500 standard cubic centimeters per minute (sccm), most preferably about 5 sccm. The total gas pressure above the liquid within the flask 32 is from about 700 millitorr to about 3 atmospheres, most preferably about 1.1 atmospheres. The inside diameter of the tube 28 is 3 millimeters and the inside diameter of the nozzle 30 is 1 millimeter. The pump 16 maintains the pressure within the chamber at about 32 Torr.

The substrate 22 may be an electrical conductor such as a metal, a semiconductor, a superconductor, or a nonconductor (insulator). Deposition of gold on gallium arsenide, silicon, germanium, silicon dioxide, and aluminum oxides has been accomplished at room temperature. The substrate may be of any convenient thickness and size, as long as the surface to be deposited upon can be reached by the ultraviolet light.

The ultraviolet light is preferably supplied by a xenon chloride excimer laser that produces a monochromatic beam of ultraviolet light at 308 nanometers wavelength. The laser is used because its light is of the required wavelength, not because of the ability to deliver high intensities of light or heat the substrate (as in a conventional thermal decomposition process). In fact, the intensity of the ultraviolet light is from about 10 milliwatts to about 1 watt per square centimeter, preferably about 150 milliwatts per square centimeter. At this intensity, the surface of the substrate is not appreciably heated, and decomposition of the organometallic compound is solely by photochemical dissociation without any substantial thermally induced dissociation. Where the temperature of the substrate is above normal room temperature, the preferred light intensity is reduced, and where the temperature of the substrate is below normal room temperature, the preferred light intensity is increased. The laser is preferably operated in a pulsed mode at a pulse rate of 40 Hertz. The output of the laser at 308 nanometers is within the absorption band of the organometallic compound, which extends generally from about 300 nanometers to about 340 nanometers but has some reduced absorption outside this range.

Other types of lasers that produce light within the absorption band are also operable. Examples include the argon ion laser, which operates at 351 nanometers and is therefore slightly outside the preferred range, the krypton chloride laser, which operates at 222 nanometers and is also slightly outside the preferred range, and lasers operating through frequency multipliers to produce light in the required range, such as neodymium YAG and dye lasers.

The deposition rate of the gold is dependent upon the gas flow rate and pressure, and the intensity and pulse rate of ultraviolet light. For the preferred xenon chloride laser, gas flow rate and light intensity indicated above, for a substrate of size 1 square centimeter, the deposition rate of a layer of gold 34 on the surface 26 of the substrate 22 is about 6000 Angstroms per hour. Layers 34 of from about 1000 to about 3000 Angstroms thickness are routinely prepared.

Layers 34 produced by the present process have been chemically analyzed for the presence of contamination by X-ray photoelectron spectroscopy and by Auger Electron Spectroscopy. The level of contamination is below the measurable level for analysis by these instruments, or less than about 1 percent. The electrical resistivity of the deposited gold layer increases with increasing impurity and contamination levels. There is no fixed, numerically defined level at which the resistivity of the gold layer becomes too high to be operable, but some users and fabricators of devices have set an impurity and contamination level of about 1 percent as a criterion of an acceptable impurity level. The gold layers of the present invention meet this criterion by having an impurity level below 1 percent, while prior approaches accomplished at low deposition temperatures do not meet the criterion. Achieving an acceptable impurity level in a low temperature deposition is important, since use of higher temperatures may cause the underlying devices to be degraded through diffusional processes.

The present approach is useful for depositing layers of gold over both large surface areas and in precisely defined patterns, as through masks. It may also be used to deposit gold into crevices, bores, and other generally inaccessible places, as long as the laser light can penetrate therein.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for depositing a layer of gold onto a substrate, comprising the steps of:
   furnishing a substrate having a surface upon which the gold is to be deposited, the substrate being at a temperature of from about 0° to about 160° C.;
   contacting the surface of the substrate with a gas containing the organometallic compound $(CH_3)_2Au[CH(COCF_3)_3]$;
   photodissociating the organometallic compound with ultraviolet light to deposit gold therefrom onto the surface of the substrate.

2. The process of claim 1, wherein the temperature of the substrate is from about 20° to about 30° C.

3. The process of claim 1, wherein the temperature of the substrate is from about 0° to about 140° C.

4. The process of claim 1, wherein the pressure of the organometallic compound $(CH_3)_2Au[CH(COCF_3)_2]$ is from about 1 millitorr to about 1 atmosphere.

5. The process of claim 1, wherein the organometallic compound $(CH_3)_2Au[CH(COCF_3)_2]$ is mixed with a carrier gas and flowed over the surface of the substrate.

6. The process of claim 5, wherein the total pressure of the organometallic compound $(CH_3)_2Au[CH(COCF_3)_2]$ and the carrier gas is from about 1 millitorr to about 1 atmosphere.

7. The process of claim 1, wherein the wavelength of the ultraviolet light is from about 300 to about 340 nanometers.

8. The process of claim 1, wherein the wavelength of the ultraviolet light is about 308 nanometers.

9. The process of claim 1, wherein the ultraviolet light is provided by a laser.

10. The process of claim 1, wherein the ultraviolet light is provided by a xenon chloride laser.

11. The process of claim 1, wherein the ultraviolet light strikes the surface of the substrate.

12. The process of claim 1, wherein the ultraviolet light passes through the vapor without striking the surface of the substrate.

13. The process of claim 1, wherein the intensity of the ultraviolet light is from about 10 milliwatts per square centimeter to about 1 watt per square centimeter.

14. The process of claim 1, wherein the substrate is an insulator.

15. The process of claim 1, wherein the substrate is a semiconductor.

16. The process of claim 1, wherein the substrate is a conductor.

17. The process of claim 1, wherein the substrate is a superconductor.

18. A process for depositing a layer of gold onto a substrate, comprising the steps of:
   furnishing a substrate having a surface upon which the gold is to be deposited, the substrate being at about ambient temperature;
   contacting the surface of the substrate with a gas containing the organometallic compound $(CH_3)_2Au[CH(COCF_3)_2]$;
   photodissociating the organometallic compound with ultraviolet light to deposit gold therefrom onto the surface of the substrate.

* * * * *